US010615807B2

(12) United States Patent
Jakobsson

(10) Patent No.: US 10,615,807 B2
(45) Date of Patent: Apr. 7, 2020

(54) SUB-SAMPLING PHASE-LOCKED LOOP

(71) Applicant: Huawei Technologies Co., Ltd., Shenzhen, Guangdong (CN)

(72) Inventor: Anders Jakobsson, Kista (SE)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/255,536

(22) Filed: Jan. 23, 2019

(65) Prior Publication Data

US 2019/0158101 A1     May 23, 2019

Related U.S. Application Data

(63) Continuation of application No. 15/660,424, filed on Jul. 26, 2017, now Pat. No. 10,224,942, which is a
(Continued)

(51) Int. Cl.
     *H03L 7/091*      (2006.01)
     *H03L 7/087*      (2006.01)
(Continued)

(52) U.S. Cl.
CPC .............. *H03L 7/091* (2013.01); *H03L 7/087* (2013.01); *H03L 7/089* (2013.01); *H03L 7/0898* (2013.01); *H03L 7/113* (2013.01)

(58) Field of Classification Search
CPC ......... H03L 7/091; H03L 7/087; H03L 7/089; H03L 7/0898; H03L 7/113
(Continued)

(56) References Cited

U.S. PATENT DOCUMENTS 5,802,123 A * 9/1998 Yoshimura ......... G11B 20/1403
327/147
2007/0147564 A1   6/2007 Fan et al.
(Continued)

FOREIGN PATENT DOCUMENTS

CN      101310440 A    11/2008
CN      102801415 A    11/2012
(Continued)

OTHER PUBLICATIONS

Karlquist et al,"A Frequency Agile 40 Gb/s Half Rate Linear Phase Detector for Data Jitter Measurement," Compound Semiconductor Integrated Circuit Symposium, pp. 33-36, XP010852427, Institute of Electrical and Electronics Engineers—New York, New York (Oct. 30, 2005).
(Continued)

*Primary Examiner* — Michael R Neff
(74) *Attorney, Agent, or Firm* — Leydig, Voit & Mayer, Ltd.

(57) ABSTRACT

A sub-sampling phase-locked loop is described, which comprises a digital-to-time converter, a sampler module, an interpolator, and a voltage controlled oscillator. The digital-to-time converter is configured to provide a first delay signal SDLY1 at a first point t1 in time and a second delay signal SDLY2 at a second point in time t2. The sampler module is configured to provide a first sample S1 of the oscillator output signal SOUT at the first point in time t1 and a second sample S2 of the oscillator output signal SOUT at the second point in time t2. The interpolator is configured to provide a sampler signal SSAMPL by interpolating the first sample S1 and the second sample S2. The voltage controlled oscillator is configured to control the oscillator output signal SOUT based on the sampler signal SSAMPL.

16 Claims, 6 Drawing Sheets

Related U.S. Application Data continuation of application No. PCT/EP2015/051676, filed on Jan. 28, 2015.

(51) Int. Cl.
    *H03L 7/089* (2006.01)
    *H03L 7/113* (2006.01)

(58) Field of Classification Search
    USPC .......................................................... 375/376
    See application file for complete search history.

(56) References Cited

U.S. PATENT DOCUMENTS

| | | | |
|---|---|---|---|
| 2010/0310031 | A1 | 12/2010 | Ballantyne et al. |
| 2012/0062292 | A1 | 3/2012 | Sai |
| 2014/0321577 | A1 | 10/2014 | Kuttner |
| 2017/0324416 | A1* | 11/2017 | Jakobsson ............... H03L 7/087 |

FOREIGN PATENT DOCUMENTS

| | | | | |
|---|---|---|---|---|
| CN | 104135251 | A | 11/2014 | |
| EP | 2782255 | A1 * | 9/2014 | ............... H03L 7/16 |
| JP | 2012060581 | A | 3/2012 | |
| JP | 2012529256 | A | 11/2012 | |

OTHER PUBLICATIONS

Gao et al, "A Low Noise Sub-Sampling PLL in Which Divider Noise is Eliminated and PD/CP Noise is Not Multiplied by N2," IEEE Journal of Solid-State Circuits, pp. 3253-3263, Institute of Electrical and Electronics Engineers—New York, New York (Dec. 2009).

Sogo et al, "A Ring-VCO-Based Sub-Sampling PLL CMOS Circuit with −119 dBc/Hz Phase Noise and 0.73 ps Jitter," ESSCIRC (ESSCIRC), pp. 253-256, Institute of Electrical and Electronics Engineers—New York, New York (Sep. 17-21, 2012).

Huang et al, "A 2.3GHz Fractional-N Dividerless Phase-Locked Loop with −112dBc./Hz In-Band Phase Noise," 2014 IEEE International Solid-State Circuits Conference, pp. 362-364, Institute of Electrical and Electronics Engineers—New York, New York (Feb. 9-13, 2014).

Raczkowski et al, "A 9.2-12.7 GHz Wideband Fractional-N Subsampling PLL in 28 nm CMOS With 280 fs RMS Jitter," IEEE Journal of Solid-State Circuits, pp. 1203-1213, Institute of Electrical and Electronics Engineers—New York, New York (May 2015).

Markulic et al, "A 10-bit, 550-fs step Digital-to-Time Converter in 28nm CMOS," 2014 IEEE, pp. 79-82, Institute of Electrical and Electronics Engineers—New York, New York (2014).

* cited by examiner

SUB-SAMPLING PHASE-LOCKED LOOP

CROSS-REFERENCE TEMPLATES

This application is a continuation of U.S. patent application Ser. No. 15/660,424, filed on Jul. 26, 2017, which is a continuation of International Application No. PCT/EP2015/051676, filed on Jan. 28, 2015. All of the afore-mentioned patent applications are hereby incorporated by reference in their entireties.

TECHNICAL FIELD

Embodiments of the present invention relate to a sub-sampling phase-locked loop. Furthermore, the embodiments of the present invention also relate to a corresponding method and a computer program.

BACKGROUND

The phase-locked loop (PLL) is an important part of radio frequency (RF) and millimetre-wave (MW) radio transmitters, as well as in test instruments and clock generators. The PLL generates a signal whose frequency is a multiple N of a reference frequency. One important figure of merit of a PLL is its spectral purity, quantified in phase noise and spurious content. Several PLL architectures have been presented in the last decades. One of the best performing PLLs regarding phase noise is the sub-sampling PLL.

A sub-sampling PLL (SS-PLL) is a feedback system, with an input reference clock with a period T, a sampler, a forward loop function and a voltage controlled oscillator (VCO). Assuming that the wanted frequency is an integer N times the reference frequency, i.e., every N'th VCO zero-crossing will coincide with a positive reference edge. At every multiple of the reference period T, the sinusoidal output of the VCO should cross zero. A small error in the VCO frequency, leads to a voltage error. It is this error voltage that is captured by the sampler.

The output of the sampler is usually configured to control a charge-pump consisting of two current sources, one with a fixed current and one with a current that can be modulated. The current sources are simultaneously connected to the output during a short pulse. The output current of the charge-pump is normally integrated and filtered by a loop-filter and then controls the output frequency of the VCO.

If the output frequency of the VCO is slightly too low, the sampler will sample the VCO sinusoid earlier in its cycle, at a lower voltage. This increases the net output current of the charge-pump. The LPF (Low Pass Filter) output voltage is increased and the VCO frequency is increased. The opposite happens if the VCO frequency is too high. This feedback loop keeps the VCO frequency at the desired multiple of the reference frequency.

Since the sampler can capture any VCO edge, a sub-sampling PLL has a small lock range. To circumvent this, a typical SS-PLL has an additional coarse locking loop. The SS-PLL loop is accompanied by a parallel traditional PLL loop as is known from conventional solutions.

The above described SS-PLL is limited to integer-N operation. A fractional-N sub-sampling PLL (SSF-PLL) can be implemented by introducing a controllable digital-to-time converter (DTC) in the reference input path. The principle behind the SSF-PLL is to delay the positive reference edge such that it coincides with the (ideal) zero-crossings of the VCO output. When the delay is more than one VCO period the previous VCO zero-crossing is sampled instead. This leads to a saw-tooth shaped delay of the reference clock.

The delay of the DTC is set in multiples of $t_D$. The ideal VCO zero-crossing will in most cases not coincide with this delay. This will lead to a so called quantization error on the sampled voltage. The sampled voltage will either be too low or too high.

The limited resolution of the DTC introduces a voltage error at the output of the sampler. This will introduce spectral degradation of the PLL output. Due to the deterministic, ramp-like shape of the DTC delay, the degradation will mostly be in the form of spurious tones. Increasing the resolution is therefore of utmost importance.

SUMMARY

An objective of the embodiments of the present invention is to provide a solution which mitigates or solves the drawbacks and problems of conventional solutions.

Another objective of the embodiments of the present invention is to provide a sub-sampling phase-locked loop with which the problem with limited resolution of digital-to-time converters is at least reduced.

An "or" in this description and the corresponding claims is to be understood as a mathematical OR which covers "and" and "or", and is not to be understand as an XOR (exclusive OR).

The above objectives are fulfilled by the subject matter of the independent claims. Further advantageous implementation forms of the embodiments of the present invention can be found in the dependent claims.

According to a first aspect of the invention, the above mentioned and other objectives are achieved with a sub-sampling phase-locked loop comprising a digital-to-time converter, a sampler module, an interpolator, and a voltage controlled oscillator. The digital-to-time converter is configured to provide a first delay signal $S_{DLY1}$ at a first point $t_1$ in time and a second delay signal $S_{DLY2}$ at a second point in time $t_2$, wherein the first point in time $t_1$ is before a first ideal sampling instant for an oscillator output signal $S_{OUT}$ and the second point in time $t_2$ is after a second ideal sampling instant for the oscillator output signal $S_{OUT}$. The sampler module is configured to provide a first sample $S_1$ of the oscillator output signal $S_{OUT}$ at the first point in time $t_1$ based on the first delay signal $S_{DLY1}$ and a second sample $S_2$ of the oscillator output signal $S_{OUT}$ at the second point in time $t_2$ based on the second delay signal $S_{DLY2}$. The interpolator is configured to provide a sampler signal $S_{SAMPL}$ by interpolating the first sample $S_1$ and the second sample $S_2$. The voltage controlled oscillator is configured to control the oscillator output signal $S_{OUT}$ based on the sampler signal $S_{SAMPL}$.

Increasing the resolution of the digital-to-time converter, DTC, in a sub-sampling phase-locked loop according to the prior art is difficult due to various implementation related reasons. The goal of the proposed invention is to reduce the impact of the limited DTC resolution.

The effect achieved by the features of the sub-sampling phase-locked loop according to the first aspect of the invention can be compared to the effect as achieved by increasing the resolution of the DTC. It is, however, easier to accomplish the above mentioned effect on the circuit level than to increase the resolution of the DTC. The result of using the proposed concept is increased spectral purity of the SSF-PLL, with lower phase noise and spurious tones. Thus, a main advantage of embodiments of the present invention is that it provides said results in a way that is easier to implement, i.e., instead of sampling at the ideal sampling instant, the sample at the ideal sampling instant is calculated by interpolation between the first sample and the second sample. Thus, it is not necessary to improve the resolution of the DTC to achieve a better sampling.

The first ideal sampling instant may be the same as the second ideal sampling instant. However it is of course also possible that the second ideal sampling instant is different from the first ideal sampling instant. The interpolator may be provided in many different ways known per se to persons skilled in the art.

In a first possible implementation form of a sub-sampling phase-locked loop according to the first aspect, the digital-to-time converter further is configured to receive a reference signal $S_{REF}$ and a control signal, wherein the control signal defines a factor between a desired frequency of the oscillator output signal $S_{OUT}$ and a frequency of the reference signal $S_{REF}$. The digital-to-time converter is further configured to produce a converter signal $S_C$ defining possible points in time for sampling and to provide the first delay signal $S_{DLY1}$ and the second delay signal $S_{DLY2}$ based on the converter signal $S_C$, the reference signal $S_{REF}$ and the control signal.

An advantage of this first possible implementation form is that the reference signal $S_{REF}$ and the control signal may come from exterior sources. This makes the sub-sampling phase-locked loop more versatile.

In a second possible implementation form of a sub-sampling phase-locked loop according to the first implementation form of the first aspect, the digital-to-time converter is further configured to determine the first ideal sampling instant and the second ideal sampling instant based on the control signal and the reference signal $S_{REF}$.

An advantage of this second possible implementation form is that the sub-sampling phase-locked loop becomes easier to implement than if the ideal sampling instants were to be determined in another way.

In a third possible implementation form of a sub-sampling phase-locked loop according to any of the first or second possible implementation forms of the first aspect or to the sub-sampling phase-locked loop as such, the sub-sampling phase-locked loop further comprises a forward transfer function module configured to filter the sampler signal $S_{SAMPL}$ to provide a filtered sampler signal $S_{FILT}$. The voltage controlled oscillator is further configured to control the oscillator output $S_{OUT}$ signal using the filtered sampler signal $S_{FILT}$.

The forward transfer function module preferably is a low pass filter, but it is possible to use also other forward transfer functions. An advantage of this third possible implementation form is that by filtering the sampler signal the loop dynamics of the sub-sampling phase-locked loop are improved. Furthermore, the filtering limits the amount of reference frequency energy (ripple) appearing at the voltage controlled oscillator. Such ripple may produce undesired FM sidebands.

In a fourth possible implementation form of a sub-sampling phase-locked loop according to any of the previously described possible implementation forms of the first aspect or to the sub-sampling phase-locked loop as such, the sampler module comprises a first sampler, and a second sampler. The first sampler is configured to provide the first sample $S_1$ based on the first delay signal $S_{DLY1}$, and the second sampler is configured to provide the second sample $S_2$ based on the second delay signal $S_{DLY2}$.

An advantage of this fourth possible implementation form is that each sampler only has to provide one sample. This makes the implementation of the samplers easier. It is of course also possible to have only one sampler, but this requires some storage unit for the first sample while the second sample is taken.

In a fifth possible implementation form of a sub-sampling phase-locked loop according to any of the previously described possible implementation forms of the first aspect or to the sub-sampling phase-locked loop as such, the interpolator is further configured to interpolate the first sample $S_1$ and the second sample $S_2$ using the formula:

$$S_{SAMPL}=(1-f)\times S_1+f\times S_2$$

wherein f is an interpolation factor having a value in the interval 0-1.

It is possible to use other formulas for the interpolation of the first and second samples. However, as the samples preferably are taken close in time around a zero crossing for the oscillator output signal the assumption that the oscillator output signal is a straight line is a very good approximation. Thus, the formula above gives a good interpolation result. It is of course possible to use another formula in case, for some reason, the oscillator output signal cannot be approximated as a straight line. An advantage of this fifth possible implementation form is that it is relatively easy to implement while it at the same time gives a good result.

In a sixth possible implementation form of a sub-sampling phase-locked loop according to the fifth possible implementation form of the first aspect or to the sub-sampling phase-locked loop as such, the interpolator comprises a first adjustable capacitor device, and a second adjustable capacitor device. The interpolator is further configured to set the capacitance value of the first adjustable capacitor device to $(1-f)\times C$ and to store the first sample $S_1$ in the first adjustable capacitor device. The interpolator is further configured to set the capacitance value of the second adjustable capacitor device to $f\times C$ and to store the second sample $S_2$ in the second adjustable capacitor device, wherein C is the maximum capacitance value of the first adjustable capacitor device and the maximum capacitance value of the second adjustable capacitor device. The interpolator is further configured to provide the sampler signal $S_{SAMPL}$ by connecting the first adjustable capacitor device in parallel with the second adjustable capacitor device.

An advantage of this sixth possible implementation form is that it is relatively easy to implement. Also, continuously adjustable capacitors are readily available. In case it is acceptable to have the capacitance value adjustable in steps the adjustable capacitors may be implemented in a large number of ways.

In a seventh possible implementation form of a sub-sampling phase-locked loop according to the sixth possible implementation form of the first aspect, the first adjustable capacitor device comprises M number of engagable unit-sized capacitors and the second adjustable capacitor device comprises M number of engagable unit-sized capacitors, wherein M≥1. The interpolator is further configured to engage M−m engagable unit-sized capacitors in the first adjustable capacitor device, wherein M≥m. The interpolator is further configured to engage m engagable unit-sized capacitors in the second adjustable capacitor device, so that the capacitance of the first adjustable capacitor device is $(M-m)\times C_{CAP}$ and the capacitance of the second adjustable capacitor device is $m\times C_{CAP}$, wherein $C_{CAP}$ is the capacitance of each unit-sized capacitor.

An advantage of this seventh possible implementation form is that it is easier to implement an adjustable capacitor with a number of engagable unit-sized capacitors. Such engagable unit-sized capacitors may easily be integrated on an integrated circuit.

In an eighth possible implementation form of a sub-sampling phase-locked loop according to the fifth possible implementation form of the first aspect, the interpolator comprises a first input configured to receive the first sample $S_1$, a second input configured to receive the second sample $S_2$, M number of resistors connected in series between the first input and the second input, wherein M≥2, and wherein the M resistors are connected with conductors, and an interpolator output. The interpolator is further configured to connect the interpolator output to any one of the conductors, the first input or the second input, so as to provide the sampler signal $S_{SAMPL}$ on the interpolator output.

This eighth possible implementation form of a sub-sampling phase-locked loop according to the first aspect of the invention is an alternative to the seventh implementation form using capacitors as described above. Depending on the application it might be advantageous to use resistors instead of capacitors.

In an ninth possible implementation form of a sub-sampling phase-locked loop according to any of the first to the fourth possible implementation form of the first aspect or to the sub-sampling phase-locked loop as such, the sub-sampling phase-locked loop further comprises an analogue-to-digital converter module configured to provide a digital signal $S_D$ by converting a difference between the first sample $S_1$ and the second sample $S_2$, and wherein the interpolator further is configured to interpolate the digital signal $S_D$ so as to provide the sampler signal $S_{SAMPL}$.

Digital interpolation is a technique known per se by persons skilled in the art and will therefore not be described in detail here. Primarily, digital interpolation is an alternative to the above described interpolation techniques. An advantage of this ninth possible implementation form of a sub-sampling phase-locked loop according to the first aspect of the invention is that digital interpolation might provide a more robust result.

In a tenth possible implementation form of a sub-sampling phase-locked loop according to any of the previously described possible implementation forms of the first aspect or to the sub-sampling phase-locked loop as such, the first ideal sampling instant is different from the second ideal sampling instant.

An advantage of this tenth possible implementation form is that the time between the samples becomes larger. This enables a single digital-to-time converter to be used, without the need for the digital-to-time converter to be able to send out two delay signals with a very short time between. Furthermore, it is also easier to implement a sub-sampling phase-locked loop according to the first aspect of the invention with only one sampler in case the first ideal sampling instant is different from the second ideal sampling instant.

In an eleventh possible implementation form of a sub-sampling phase-locked loop according to the tenth possible implementation form of the first aspect, the first ideal sampling instant and the second ideal sampling instant are in consecutive periods of the reference signal $S_{REF}$.

An advantage of this eleventh possible implementation form is that this gives the best interpolation result in case the first ideal sampling instant is different from the second ideal sampling instant.

According to a second aspect of the invention, the above mentioned and other objectives are achieved with a method comprising the steps of providing a first delay signal $S_{DLY1}$ at a first point $t_1$ in time and a second delay signal $S_{DLY2}$ at a second point in time $t_2$, wherein the first point in time $t_1$ is before a first ideal sampling instant for the oscillator output signal $S_{OUT}$ and the second point in time $t_2$ is after a second ideal sampling instant for the oscillator output signal $S_{OUT}$. The method further comprises the steps of providing at least a first sample $S_1$ of the oscillator output signal $S_{OUT}$ at the first point in time $t_1$ based on the first delay signal $S_{DLY1}$ and a second sample $S_2$ of the oscillator output signal $S_{OUT}$ at the second point in time $t_2$ based on the second delay signal $S_{DLY2}$. The method further comprises the steps of providing a sampler signal $S_{SAMPL}$ by interpolating the first sample $S_1$ and the second sample $S_2$, and controlling the oscillator output signal $S_{OUT}$ based on the sampler signal $S_{SAMPL}$.

The effect achieved by the features of the method according to the second aspect of the invention can be compared to the effect as achieved by decreasing the time between the first point in time $t_1$ and the second point in time $t_2$. It is, however, easier to perform the method according to the second aspect of the invention than it is to decrease the time between the first point in time $t_1$ and the second point in time $t_2$. The result of using the proposed concept is increased spectral purity of the oscillator output signal $S_{OUT}$, with lower phase noise and spurious tones. Thus, a main advantage of embodiments is that they provide said results in a way that is easier to implement.

According to a third aspect of the invention, the above mentioned and other objectives are achieved with a computer program with a program code for performing a method according to the second aspect of the invention when the computer program runs on a computer.

SHORT DESCRIPTION OF THE DRAWINGS

DETAILED DESCRIPTION

Figure 1:
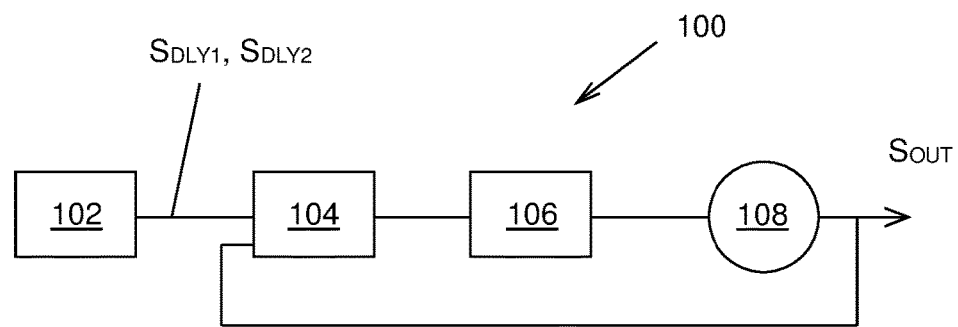
FIG. 1 shows schematically a sub-sampling phase-locked loop according to an embodiment of the present invention.

In the following detailed description the same reference numeral will be used for the corresponding feature in the different drawings.

FIG. 1 shows schematically a sub-sampling phase-locked loop 100 according to an embodiment of the present invention. The sub-sampling phase-locked loop 100 comprises a digital-to-time converter 102, a sampler module 104, an interpolator 106, and a voltage controlled oscillator 108. The digital-to-time converter 102 is configured to provide a first delay signal $S_{DLY1}$ at a first point $t_1$ in time and a second delay signal $S_{DLY2}$ at a second point in time $t_2$. The first point in time $t_1$ is before a first ideal sampling instant for an oscillator output signal $S_{OUT}$ and the second point in time $t_2$ is after a second ideal sampling instant for the oscillator output signal $S_{OUT}$. The first ideal sampling instant may according to an embodiment be the same sampling instant as the second ideal sampling instant. The sampler module 104 is configured to provide a first sample $S_1$ of the oscillator output signal $S_{OUT}$ at the first point in time $t_1$ based on the first delay signal $S_{DLY1}$ and a second sample $S_2$ of the oscillator output signal $S_{OUT}$ at the second point in time $t_2$ based on the second delay signal $S_{DLY2}$. The interpolator 106 is configured to provide a sampler signal $S_{SAMPL}$ by interpolating the first sample $S_1$ and the second sample $S_2$. Thus, the sampler signal is an interpolation taking into account a first time difference between the first point in time $t_1$ and the first ideal sampling instant and a second time difference between the second point in time $t_2$ and the second ideal sampling instant. The first and second ideal sampling instants are at zero crossings for an ideal signal/desired signal.

According to an embodiment the interpolation is linear. Thus, the sample taken closest to the ideal sampling instant is given most weight in the interpolation. In this way a sampler signal is provided which corresponds to a sampler signal based on a sample taken at the ideal sampling instant. The voltage controlled oscillator 108 is configured to control the oscillator output signal $S_{OUT}$ based on the sampler signal $S_{SAMPL}$. In this way the frequency of the voltage controlled oscillator is controlled to the desired frequency.

Figure 2:
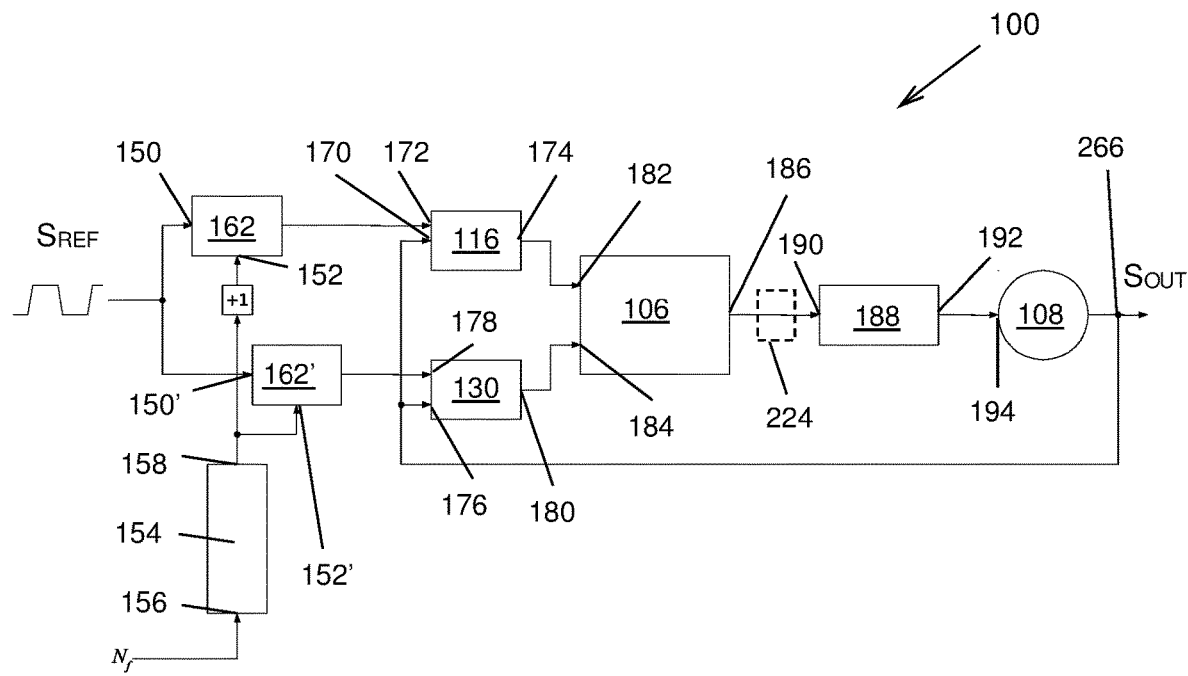
FIG. 2 shows a sub-sampling phase-locked loop according to a further embodiment of the present invention comprising two separate DTCs.

FIG. 2 shows a sub-sampling phase-locked loop 100 according to a further embodiment of the present invention wherein the digital-to-time converter comprises two separate digital-to-time converter modules (DTC) 162, 162'. The sub-sampling phase-locked loop 100 according to the shown embodiment also comprises a modulator 154 comprising an input 156 and an output 158. The modulator 154 is configured to receive a control signal $N_f$ on the input and to provide control signals for the DTCs 162, 162', on the output 158. The control signal $N_f$ defines a factor between a desired frequency of the oscillator output signal $S_{OUT}$ and a frequency of the reference signal $S_{REF}$. The modulator 154 is configured to provide modulator signals on its output 158 for controlling the digital-to-time converter modules. Each digital-to-time converter 162, 162', comprises a first input 150, 150', and a second input 152, 152'. Each digital-to-time converter module 162, 162' is configured to receive a reference signal $S_{REF}$ on said first input 150, 150', and a modulator signal from the output 158 of the modulator 154 on the second input 152, 152'.

Each delay signal produced by the DTCs 162, 162' defines the point in time when a sample of the oscillator output signal $S_{OUT}$ is to be taken by a downstream sampler. The DTCs 162, 162', are configured to produce a converter signal $S_C$ defining possible points in time for sampling and to provide the first delay signal $S_{DLY1}$ and the second delay signal $S_{DLY2}$ based on the converter signal $S_C$, the reference signal $S_{REF}$ and the control signal $N_f$.

Figure 4:
FIG. 4 shows schematically an interpolator and a sampler according to an embodiment of the invention.
Figure 5:
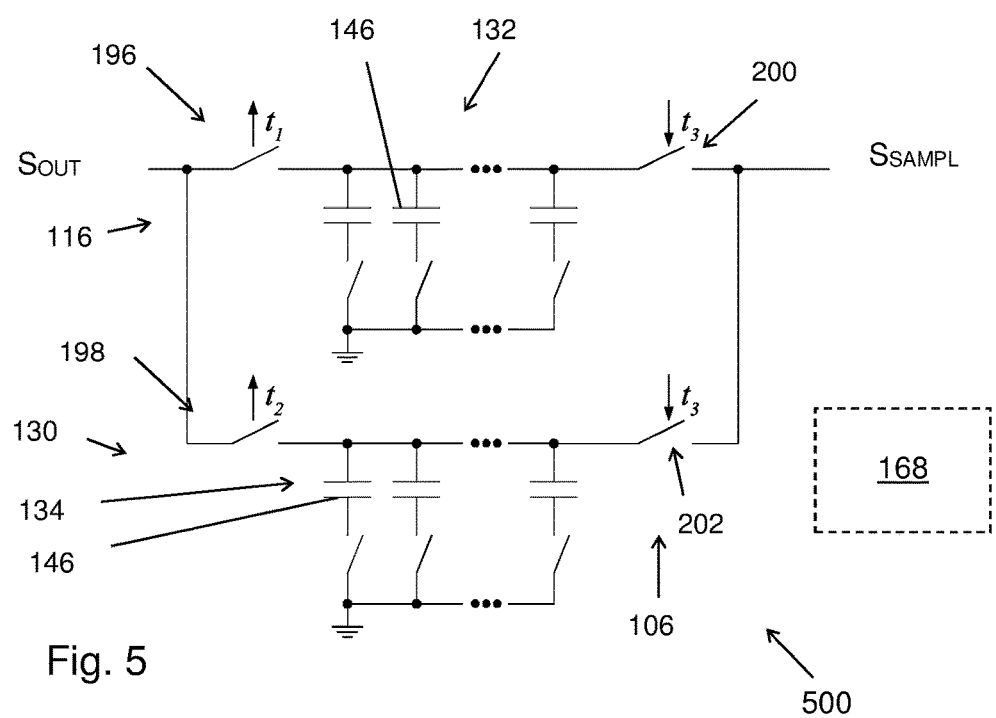
FIG. 5 shows an interpolator and a sampler according to an embodiment of the present invention, which interpolator comprises discrete capacitances.

The sub-sampling phase-locked loop 100 in FIG. 2 further comprises a first sampler 116 with an input 170 for the oscillator output signal $S_{OUT}$, a delay signal input 172 for the first delay signal $S_{DLY1}$ and an output 174 for the first sample $S_1$. The sub-sampling phase-locked loop 100 in FIG. 2 further comprises a second sampler 130 with an input 176 for the oscillator output signal $S_{OUT}$, a delay signal input 178 for the second delay signal $S_{DLY2}$ and an output 180 for the second sample $S_2$. The first sampler 116 is configured to sample the oscillator output signal $S_{OUT}$ at the first point in time $t_1$ based on the first delay signal $S_{DLY1}$ to derive the first sample $S_1$. The second sample 130 is configured to sample the oscillator output signal $S_{OUT}$ at the second point in time $t_2$ based on the second delay signal $S_{DLY2}$ to derive the second sample $S_2$. The first sampler 116 and second sampler 130 form together a possible implementation for the sampler module 104 shown in FIG. 1. The first sampler 116 and the second sampler 130 each comprise means, such as a capacitor, for measuring and storing a voltage. Possible implementations of samplers are shown in FIG. 4 and FIG. 5.

The sub-sampling phase-locked loop 100 further comprises an interpolator 106 with a first input 182 for the first sample from the first sampler 116, a second input 184 for the second sample from the second sampler and an output 186. The interpolator 106 is configured to interpolate between the samples to produce the sampler signal $S_{SAMPL}$ which is provided on the output 186 of the interpolator 106. The sub-sampling phase-locked loop further comprises a filter 188 comprising an input 190 connected to the output of the interpolator 106 and an output 192. The filter 188 is configured to low-pass filter the sampler signal $S_{SAMPL}$. Furthermore, the sub-sampling phase-locked loop comprises a voltage controlled oscillator 108 which comprises an input 194 coupled to the output of the filter and an output 266 for the oscillator output signal Sour. The voltage controlled oscillator is configured to control the oscillator output signal $S_{OUT}$ based on the filtered sampler signal. An intermediate circuit called a charge-pump 224 may be arranged between the interpolator 106 and the filter 188 as is indicated by the dashed line. The charge-pump 224 functions as a matching circuit between the interpolator 106 and the filter 188.

Figure 3:
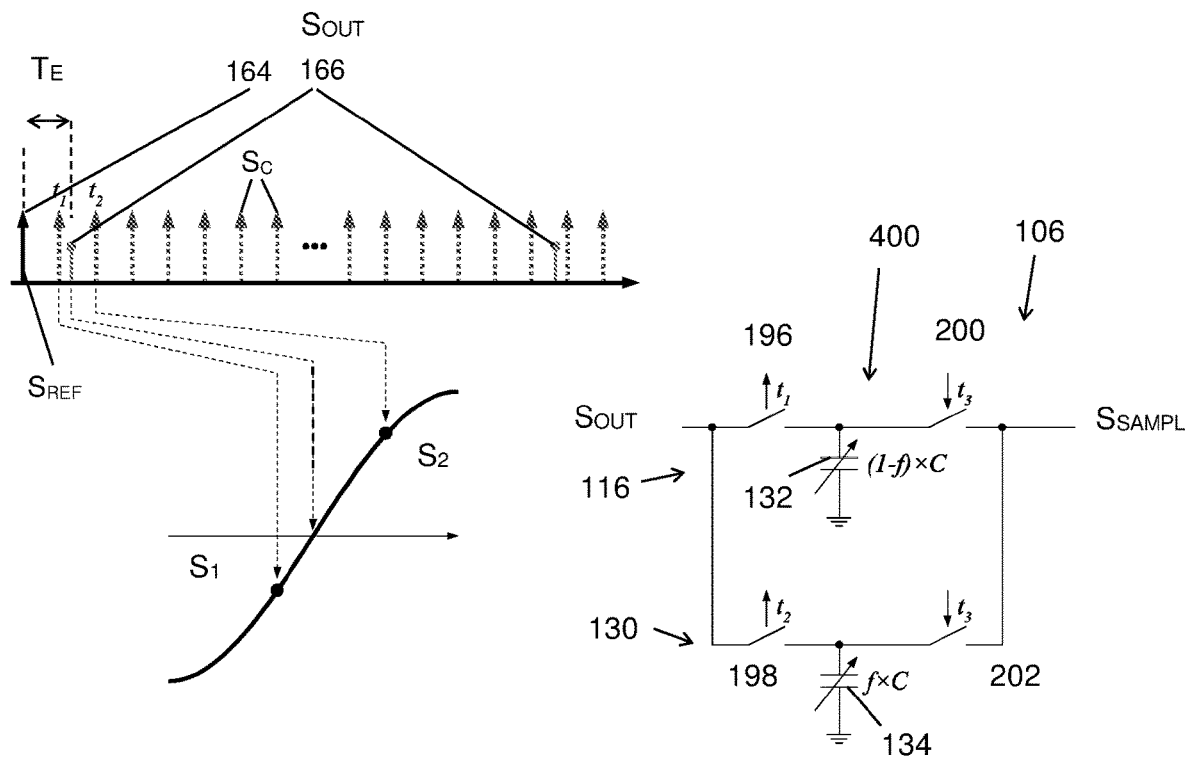
FIG. 3 is a timing diagram showing the relationship between the reference signal $S_{REF}$, the oscillator output signal $S_{OUT}$, and the converter signal $S_C$ from the DTC.

FIG. 3 is a timing diagram showing the relationship between the reference signal $S_{REF}$, the oscillator output signal $S_{OUT}$, and the converter signal $S_C$ from the DTC. FIG. 3 also shows a small part of the oscillator output signal $S_{OUT}$ and the points in time for sampling $t_1$, $t_2$. A zero crossing 164 from negative voltage to positive voltage for the oscillator output signal $S_{OUT}$ is shown together with a zero crossings 166 from negative voltage to positive voltage for the reference signal $S_{REF}$. Both zero crossings could be used as ideal sampling instants. In this example it should be understood that the zero crossings 164 correspond to the mentioned ideal sampling instants. $S_1$ and $S_2$ are the first and second samples taken at the times $t_1$ and $t_2$. As is shown in FIG. 3 the first point in time $t_1$ is before the zero crossing 164 of the oscillator output signal $S_{OUT}$ and the second point in time $t_2$ is after the zero crossing 164 of the oscillator output signal $S_{OUT}$. The digital-to-time converter or converters provide(s) a first delay signal $S_{DLY1}$ (e.g. a rising or falling edge) at the first point in time $t_1$ and a second delay signal $S_{DLY2}$ (e.g. a rising or falling edge) at the second point in time $t_2$.

Assuming that the oscillator output signal $S_{OUT}$ and the reference signal $S_{REF}$ are aligned at t=0, then, for a fractional ratio $N=N_i+N_f$, $0 \le N_f < 1$, the $N_i$'th oscillator output signal zero-crossing happens slightly before the reference edge. The $(N_i-1)$'th zero-crossing comes slightly after the reference edge. The time difference $T_E$ is given by:

$$T_E = (1-N_f) \times t_{VCO}$$

where $t_{VCO}$ is the period of the oscillator output signal.

It is also convenient to express this delay in number of oscillator output signal cycles, or:

$$N_E = 1 - N_f$$

Note that these delays are constants for any given output frequency. The delay at the k'th reference cycle is given by:

$$n_E[k] = k \times N_E = k \times (1-N_f)$$

$$t_E[k] = n_E[k] \times t_{VCO} = k \times (1-N_f) \times t_{VCO}$$

The principle behind the sub-sampling phase-locked loop is to delay the positive reference edge such that it coincides with the ideal zero-crossings of the oscillator output signal $S_{OUT}$. When the delay is more than one period of the oscillator output signal $S_{OUT}$ ($n_E[k] \ge 1$), the previous $S_{OUT}$ zero-crossing is sampled instead. This leads to a saw-tooth shaped delay of the reference signal $S_{REF}$.

A modified expression for the delay $n_E[k]$ is given by $$n_E[k] = (k \times (1-N_f)) \bmod 1$$

where mod is the modulus operator.

The digital-to-time converter can be implemented in several ways, which are known to persons skilled in the art and will not be discussed in detail here.

FIG. 4 shows schematically an interpolator-sampler module 400 comprising a combination of an interpolator 106 and a sampler according to an embodiment of the invention. The oscillator output signal $S_{OUT}$ is sampled twice using a delay $$t_1 = \Delta t \times \left\lfloor \frac{t_E}{\Delta t} \right\rfloor \text{ and } t_2 = \Delta t \times \left\lceil \frac{t_E}{\Delta t} \right\rceil,$$

i.e., one sample before and one sample after the ideal sampling instant. $\Delta t$ is the resolution of the converter signal $S_C$ and is thus the smallest possible time between two consecutive samples of the oscillator output signal.

The interpolator-sampler module 400 comprises a first adjustable capacitor device 132 and a second adjustable capacitor device 134. The interpolator-sampler module 400 further comprises a first switch 196 arranged between the first input and the first adjustable capacitor device 132 and a second switch 198 arranged between the second input and the second adjustable capacitor device 134. The interpolator-sampler module 400 further comprises a third switch 200 arranged between the first adjustable capacitor device and the output of the interpolator-sampler module 400 and a fourth switch 202 arranged between the second adjustable capacitor device and the output 186. The interpolator-sampler module 400 further comprises a controller 168 which is configured to adjust the capacitance of the adjustable capacitor devices 132, 134, and the switches 196, 198, 200 and 202. The first switch 196 and the first adjustable capacitor device 132 constitute a first sampler 116. The second switch 198 and the second adjustable capacitor device 134 constitute a second sampler 130. The switches 200 and 202 together with the node at the outputs of the switches 200, 202, constitute an interpolator 106. During a track phase, the first switch 196 and the second switch 198 are closed and the third switch 200 and the fourth switch 202 are open. The voltage over each one of the first adjustable capacitor device 132 and the second adjustable capacitor device 134 tracks the input voltage (the voltage of the oscillator output signal $S_{OUT}$). The first adjustable capacitor device 132 holds a charge of $Q_1(t) = S_{OUT}(t) \times (1-f) \times C$, $0 \le f < 1$, wherein $(1-f) \times C$ is the capacitance of the first adjustable capacitor device 132. Similarly, the second adjustable capacitor device holds a charge of $Q_2(t) = S_{OUT}(t) \times f \times C$, wherein $f \times C$ is the capacitance of the second adjustable capacitor device 134.

During the hold phase, the first switch 196 and the second switch 198 are opened. The first switch 196 is opened at $t=t_1$, (the first point in time indicated by the first delay signal $S_{DLY1}$) and the second switch 198 is opened at $t=t_2$ (the second point in time indicated by the second delay signal $S_{DLY2}$). At $t=t_3 > t_2 > t_1$, the third switch and the fourth switch are closed simultaneously. The total charge is now distributed over the two capacitors, whose total capacitance is C. The voltage therefore becomes:

$$S_{SAMPL} = \frac{Q_{tot}}{C_{tot}} = \frac{S_{OUT}(t_2) \times f \times C + S_{OUT}(t_1) \times (1-f) \times C}{C} = (1-f) \times S_1 + f \times S_2.$$

Using this technique, the voltages are interpolated by the factor f.

FIG. 5 shows schematically a further possible interpolator-sampler module 500 comprising a first adjustable capacitor device 132 and a second adjustable capacitor device 134. The first adjustable capacitor device 132 comprises M number of engagable unit-sized capacitors 146, and the second adjustable capacitor device 134 comprises M number of engagable unit-sized capacitors 146, wherein $M \ge 1$. The interpolator-sampler module 500 is further configured to engage M−m engagable unit-sized capacitors 146 in the first adjustable capacitor device 132, wherein $M \ge m$, and to engage m engagable unit-sized capacitors 146 in the second adjustable capacitor device 134, so that the capacitance of the first adjustable capacitor device 132 is $(M-m) \times C_{CAP}$ and the capacitance of the second adjustable capacitor device 134 is $m \times C_{CAP}$, wherein $C_{CAP}$ is the capacitance of each unit-sized capacitor 146.

The interpolator-sampler module 500 further comprises a first switch 196 arranged between the first input and the first adjustable capacitor device 132 and a second switch 198 arranged between the second input and the second adjustable capacitor device 134. The interpolator-sampler module 500 further comprises a third switch 200 arranged between the first adjustable capacitor device and the output of the interpolator 106 and a fourth switch 202 arranged between the second adjustable capacitor device and the output 186. The first switch 196 and the first adjustable capacitor device 132 constitute a first sampler 116. The second switch 198 and the second adjustable capacitor device 134 constitute a second sampler 130. The switches 200 and 202 together with the node at the outputs of the switches 200, 202, constitute an interpolator 106. The interpolator-sampler module 500 further comprises a controller 168 which is configured to adjust the capacitance of the adjustable capacitor devices 132, 134, and the switches 196, 198, 200 and 202. The adjustable capacitor according to this embodiment is relatively uncomplicated to implement. The function of the interpolator 106 and sampler according to this embodiment is the same as has been described in relation to the embodiment of FIG. 4. The controller 168 may be integrated into the interpolator-sampler module 500, may be a separate unit or may be a computer program executed on a central control unit.

Figure 6:
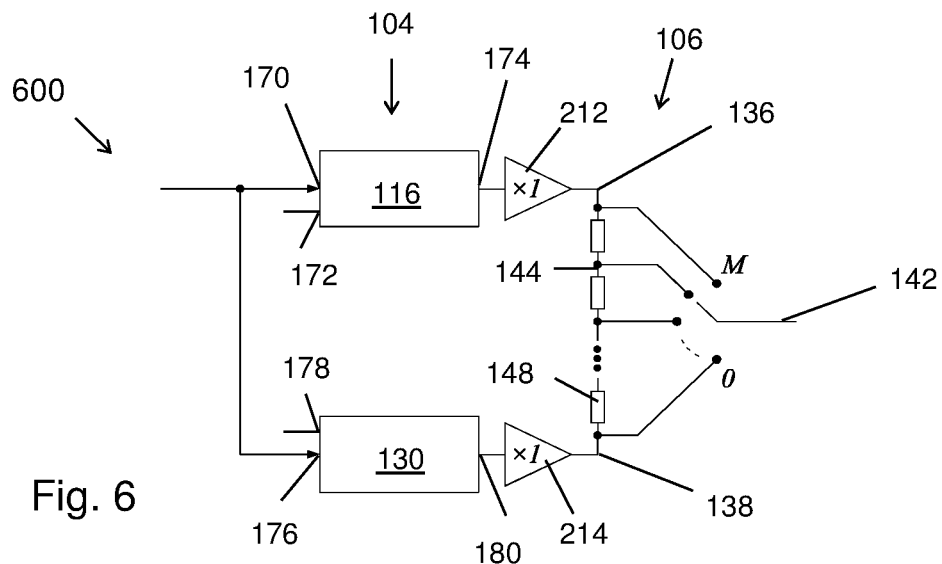
FIG. 6 shows an interpolator and a sampler according to a further embodiment of the present invention, which interpolator comprises a resistive ladder.

FIG. 6 shows schematically a further possible interpolator-sampler module 600 comprising an interpolator 106 and a sampler module 104 according to a further embodiment of the present invention, which interpolator 106 comprises a resistive ladder. The interpolator-sampler module 600 comprises a first sampler 116 with an input 170 for the oscillator output signal Siam a delay signal input 172 for the first delay signal $S_{DLY1}$ and an output 174 for the first sample $S_1$. The interpolator-sampler module 600 further comprises a second sampler 130 with an input 176 for the oscillator output signal Siam a delay signal input 178 for the second delay signal $S_{DLY2}$ and an output 180 for the second sample $S_2$. A first buffer amplifier 212 is connected to the output 174 of the first sampler 116 and a second buffer amplifier 214 is connected to the output 180 of the second sampler 130 to provide a high-ohmic load for each sampler.

The interpolator 106 comprises a first input 136 configured to receive the first sample $S_1$ and a second input 138 configured to receive the second sample $S_2$. The interpolator 106 further comprises M number of resistors 148 connected in series between the first input 136 and the second input 138, wherein M≥2, and wherein the M resistors 148 are connected with conductors 144, and an interpolator output 142. The interpolator 106 is further configured to connect the interpolator output 142 to any one of the conductors 144, the first input 136 or the second input 138, so as to provide the sampler signal $S_{SAMPL}$ on the interpolator output 142. The interpolator-sampler module 600 further comprises a controller which is configured to control to which conductor 144 the output is to be connected. The controller may alternatively be part of a central control unit or processor. The output voltage is taken over the m'th resistor, giving an output voltage of:

$$S_{SAMPL} = S_1 + \frac{m \times R}{M \times R} \times (S_2 - S_1) = \left(1 - \frac{m}{M}\right) \times S_1 + \frac{m}{M} \times S_2$$

Figure 7:
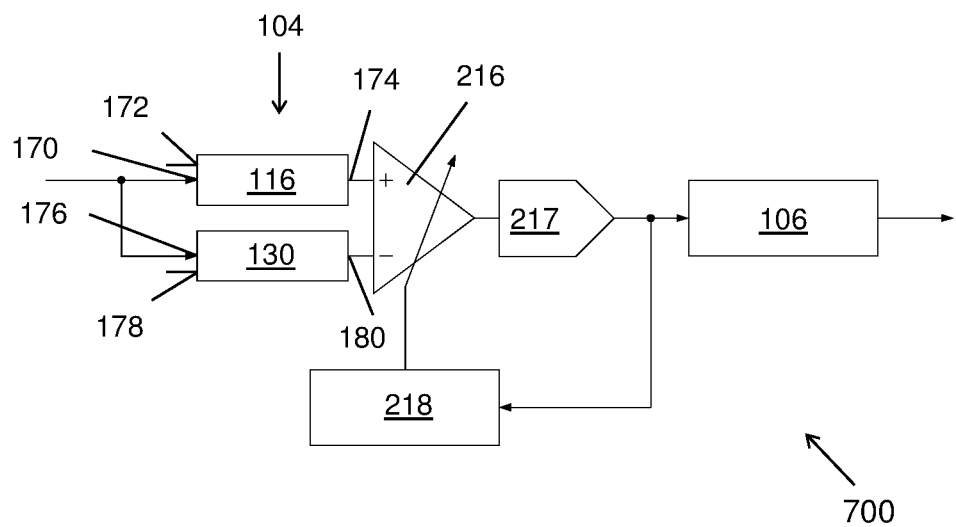
FIG. 7 shows an interpolator and a sampler according to a further embodiment of the present invention, which interpolator is configured to work in the digital domain.

FIG. 7 shows an interpolator-sampler module 700 according to a further embodiment of the present invention. The interpolator-sampler module 700 comprises a first sampler 116 with an input 170 for the oscillator output signal $S_{OUT}$, a delay signal input 172 for the first delay signal $S_{DLY1}$ and an output 174 for the first sample $S_1$. The interpolator-sampler module 700 further comprises a second sampler 130 with an input 176 for the oscillator output signal $S_{OUT}$, a delay signal input 178 for the second delay signal $S_{DLY2}$ and an output 180 for the second sample $S_2$. The interpolator-sampler module 700 in FIG. 7 also comprises a variable gain amplifier 216 which is connected to the output 174 of the first sampler 116 and the output 180 of the second sampler 130. The interpolator-sampler module 700 comprises a variable gain amplifier 216 an analogue-to-digital converter 217, a gain adjustment block 218 and a digital interpolator 106 configured to work in the digital domain. The difference between the output of the first sampler 116 and the output of the second sampler 130, i.e., the difference between the first sample $S_1$ and the second sample $S_2$, is amplified by the variable gain amplifier VGA. The amplified signal is then converted to a digital signal using the analogue-to-digital converter ADC. The gain adjustment block 218 forms a feedback loop that adjusts the gain of the VGA such that the full range of the analogue-to-digital converter ADC is used. The output of the digital interpolator 220 is a digital word, and may be used as is or converted back to analogue again. In case a digital word is to be used to control the voltage controlled oscillator 108 the voltage controlled oscillator has to be adapted to be controlled by a digital word.

Figure 8:
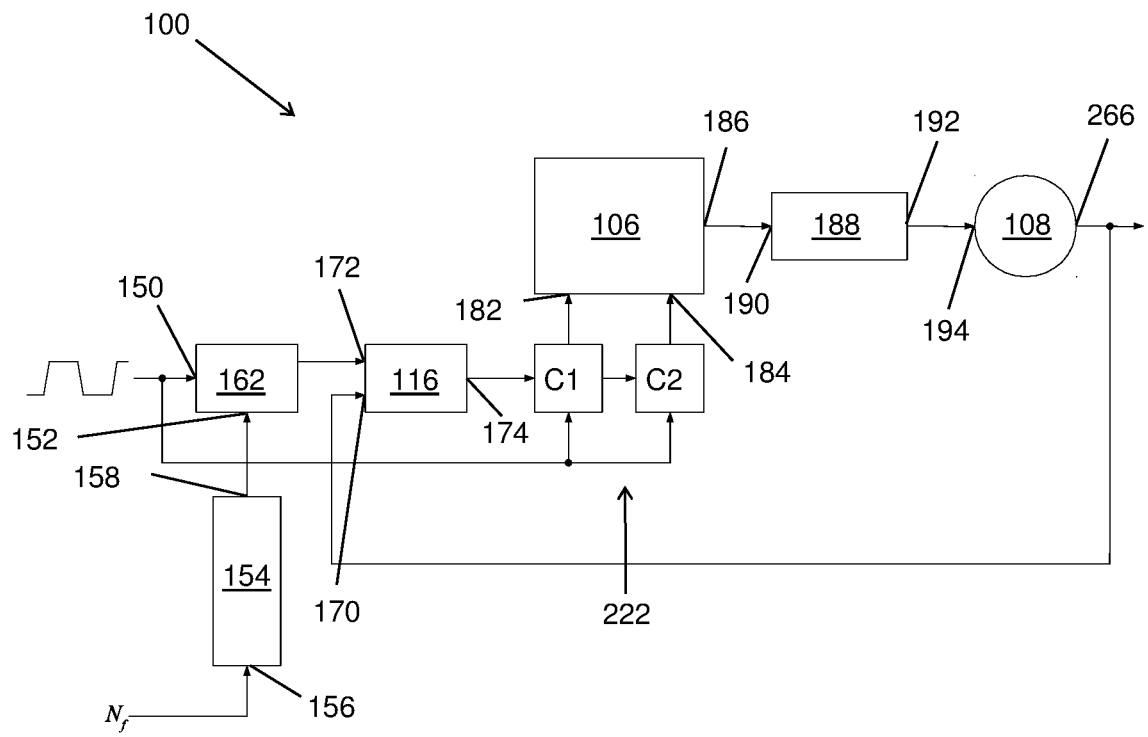
FIG. 8 shows a sub-sampling phase-locked loop according to a further embodiment of the present invention, which sub-sampling phase-locked loop is configured to interpolate two consecutive samples.

FIG. 8 shows a sub-sampling phase-locked loop 100 according to a further embodiment of the present invention, wherein the sub-sampling phase-locked loop 100 is configured to interpolate two consecutive samples. Thus, the first ideal sampling instant is different from the second ideal sampling instant. The sub-sampling phase-locked loop 100 comprises a digital-to-time converter module DTC 162. The sub-sampling phase-locked loop 100 according to the shown embodiment also comprises a modulator 154 comprising an input 156 and an output 158. The modulator 154 is configured to receive a control signal $N_f$ on the input and to provide control signals for the DTC on the output 158. The control signal $N_f$ defines a factor between a desired frequency of the oscillator output signal $S_{OUT}$ and a frequency of the reference signal $S_{REF}$. The modulator 154 is configured to provide modulator signals on its output 158 for controlling the digital-to-time converter module 162. The digital-to-time converter 162, comprises a first input 150, and a second input 152. The digital-to-time converter module 162 is configured to receive a reference signal $S_{REF}$ on said first input 150, and a modulator signal from the output 158 of the modulator 154 on the second input 152, the delay signal defining the point in time when a sample of the oscillator output signal is to be taken. The DTCs are configured to produce a converter signal $S_C$ defining possible points in time for sampling and to provide the first delay signal $S_{DLY1}$ and the second delay signal $S_{DLY2}$ based on the converter signal $S_C$, the reference signal $S_{REF}$ and the control signal. The sub-sampling phase-locked loop 100 further comprises a sampler 116 with an input 170 for the oscillator output signal Siam a delay signal input 172 for the first delay signal $S_{DLY1}$ and an output 174 for the first sample $S_1$ and the second sample $S_2$. The sub-sampling phase-locked loop 100 further comprises an analogue shift register 222 having a first cell C1 and a second cell C2. Each sample $S_1$, $S_2$, is injected into the cells C1, C2, of the analogue shift register 222, and the interpolation is performed between sample $S_1=S[k]$ and $S_2=S[k-1]$. The delay at reference cycle k is d(k). The ideal delay at reference cycle k, expressed as number of DTC delays, is given by $$d_i[k] = \frac{t_E[k]}{\Delta t}$$

Since the DTC delays the input by an integer number of cycles, this number must be rounded to an integer. If the delay is rounded down on even cycles (k=0, 2, . . . ) and up on odd cycles (k=1, 3, . . . ), the samples $S_1$, $S_2$, will be alternating between being too low and too high. The voltage at each cycle can be expressed as:

$$S_{OUT}[k] = S_q[k] + S_e[k] = \left[\left(\frac{2 \cdot \pi}{t_{VCO}}\right) \times (d[k] - d_i[k]) \times \Delta t\right] + S_e[k]$$

The term $S_q[k]$ is the voltage due to DTC quantization. The term $S_e[k]$ is the voltage due to VCO phase fluctuations. The later is the quantity we wish to sample. In the above equation, it is assumed that the sampler is operating in a small region around the zero-crossing of the VCO signal, such that it can be approximated as a linear function. The sub-sampling phase-locked loop 100 further comprises an interpolator 106 with a first input 182 for the first sample from the first cell C1, a second input 184 for the second sample from the second cell C2 and an output 186. The interpolator 106 is configured to interpolate between the samples to produce the sampler signal $S_{SAMPL}$ which is provided on the output 186 of the interpolator 106. The sub-sampling phase-locked loop further comprises a filter 188 comprising an input 190 connected to the output of the interpolator 106 and an output 192. The filter 188 is configured to low-pass filter the sampler signal $S_{SAMPL}$. Furthermore, the sub-sampling phase-locked loop comprises a voltage controlled oscillator 108 which comprises an input 194 coupled to the output of the filter and an output 266 for the oscillator output signal $S_{OUT}$. The voltage controlled oscillator 108 is configured to control the oscillator output signal $S_{OUT}$ based on the filtered sampler signal.

Figure 9:
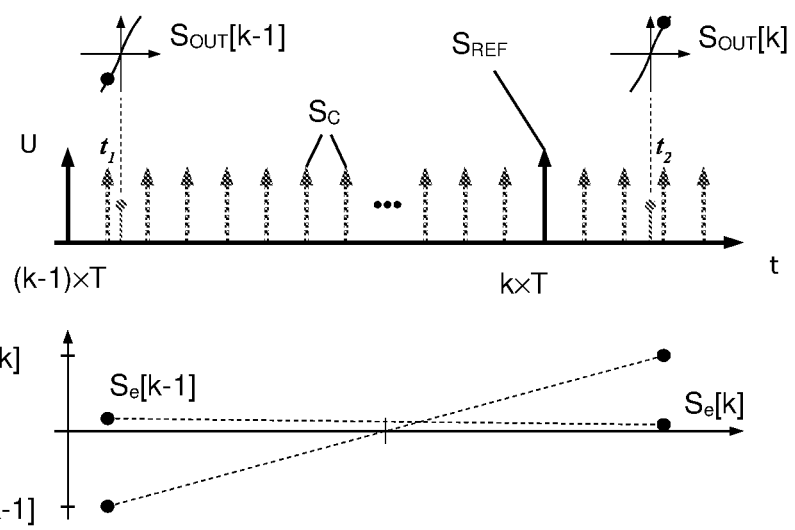
FIG. 9 is a timing diagram showing the relationship between the reference signal $S_{REF}$, the oscillator output signal $S_{OUT}$, and the converter signal $S_C$ from the DTC.

FIG. 9 is a timing diagram showing the relationship between the reference signal $S_{REF}$, the oscillator output signal $S_{OUT}$, and the converter signal $S_C$ from the DTC. FIG. 9 shows two consecutive samples, one at $t=(k-1)\times T$ and one at $t=k\times T$.

If we assume that $Se[k]$ does not change much from cycle to cycle, i.e., $|S_e[k]-S_e[k-1]|\ll|S_q[k]-S_q[k-1]|$, sample $S_s[k]$ and $S_s[k-1]$ can be interpolated such that $S_q[k]$ is removed and only $S_e[k]$ remains. This assumption holds for a PLL, since the high frequency noise on $S_e[k]$ is usually small. The interpolation factor is given by $$f[k] = -\frac{S_{OUT}[k-1]}{S_{OUT}[k]-S_{OUT}[k-1]} = \frac{d_i[k-1]-d[k-1]}{d[k]-d_i[k]-d[k-1]+d_i[k-1]}$$

The actual interpolation can be performed as described in previous sections, using a capacitive interpolator, a resistive interpolator or a digital interpolator.

Figure 10:
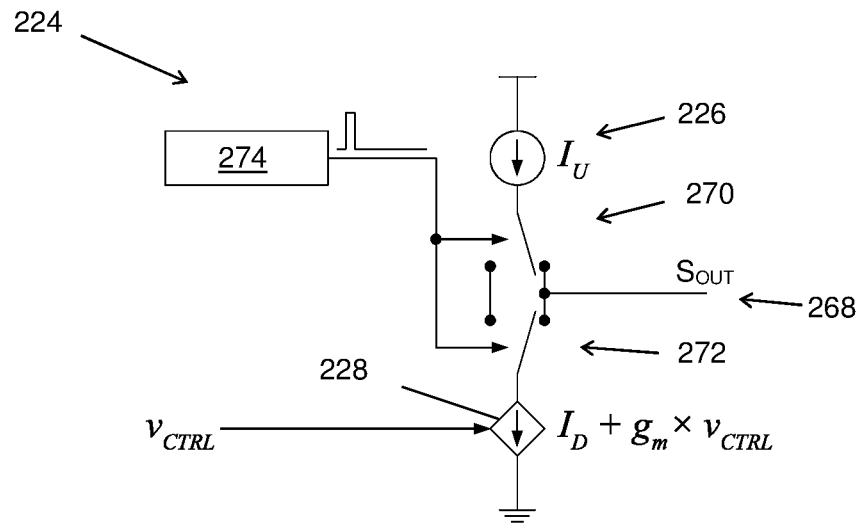
FIG. 10 shows a charge-pump which may be used in sub-sampling phase-locked loops according to embodiments of the invention.

FIG. 10 shows a charge-pump 224 which may be used in sub-sampling phase-locked loops according to embodiments of the invention as is shown, e.g., in FIG. 2. The charge-pump 224 comprises a first current source 226 with a fixed current ($I_U$), and a second current source 228 with a current that can be modulated ($I_D+g_m\times v_{CTRL}$). The charge pump also comprises an output 268. The current sources are simultaneously connected to the output 268 during a short pulse, and the net output current becomes $I_U-I_D-g_m\times v_{CTRL}$. The duty-cycle of the output pulse sets the overall gain of the charge-pump 224. The charge-pump also comprises a first switch 270 between the first current source 226 and the output 268 and a second switch 272 between the second current source 228. The charge-pump 224 also comprises a pulser 274 which is configured to control the first switch 270 and the second switch 272.

Figure 11:
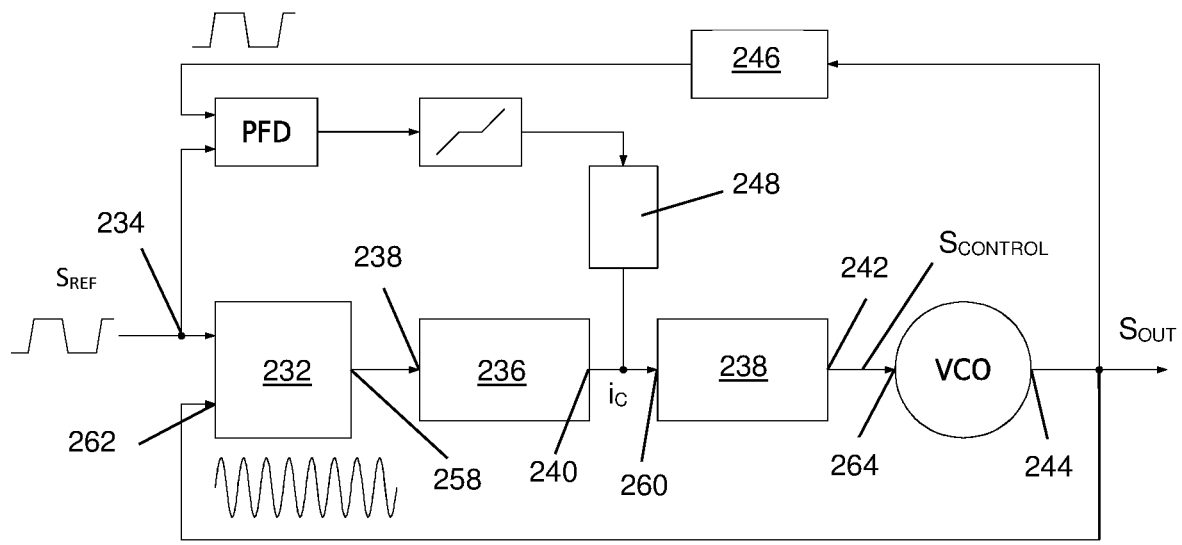
FIG. 11 shows a sub-sampling phase-locked loop connected with a coarse locking phased locked loop.

FIG. 11 shows a circuit comprising a sub-sampling phase-locked loop connected with a coarse locking phased locked loop. The circuit comprises a sampler 232 with an input 234 for a reference signal $S_{REF}$ and an input 262 for an oscillator output signal $S_{OUT}$, and an output 258 for a sample $S_1$. The circuit further comprises a first charge pump 236 with an input 238 for the sample $S_1$ and an output 240 for a control current $i_{CP}$. The circuit further comprises a loop filter 238 with an input 260 for the control current $i_{CP}$, and an output 242 for a filtered control signal $S_{CONTROL}$. The circuit further comprises a voltage controlled oscillator VCO with an input 264 for the filtered control signal $S_{CONTROL}$, and an output 244 for the oscillator output signal $S_{OUT}$. Since the sampler 232 can capture any VCO edge, not just the N'th edge, a sub-sampling PLL has a small lock range. To circumvent this, a typical SS-PLL has an additional coarse locking loop, as shown in FIG. 11. The circuit thus further comprises a divide-by-N-member 246, a phase-frequency detector PFD and an additional charge-pump 248. The output current of the second charge-pump 248 is added to that of the first charge-pump 236. This traditional PLL loop has a large locking range. To disable the coarse PLL loop once it has locked, a dead-zone is added to the PFD output such that for small phase differences, its output is zero. In possible further embodiments of the invention the described coarse locking phased locked loop may be used together with the above described embodiments of the sub-sampling phase-locked loop 100.

Figure 12:
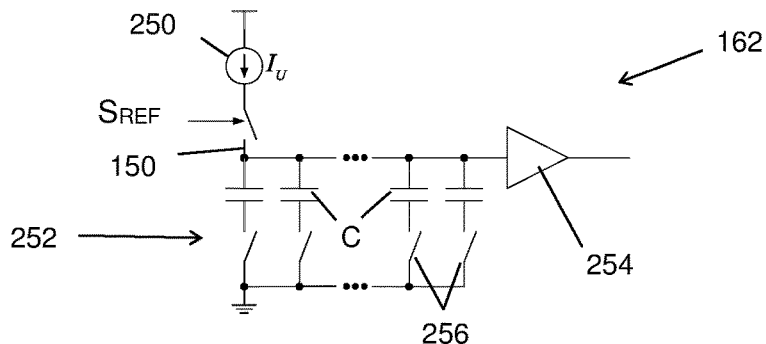
FIG. 12 shows a charge-pump based DTC which may be used in a sub-sampling phase-locked loop according to an embodiment of the invention.

FIG. 12 shows a charge-pump based digital-to-time converter DTC 162 which may be used in a sub-sampling phase-locked loop according to an embodiment of the invention. The DTC 162 comprises a first input 150 for a reference signal $S_{REF}$. The DTC 162 further comprises a current source 250, a number of capacitors C and switches 256 in a capacitor bank 252 and a logic buffer 254. When the reference clock $S_{REF}$ goes high, the current source 250 charges the capacitor bank. When the threshold voltage of the logic buffer 254 is reached, the output signal of the DTC $S_{DLY}$ transitions from low to high. The time it takes to charge the capacitor bank depends on the number of switches 256 that are closed. It is thereby possible, using a digital control, to set the delay in multiples of $t_D$. Note that for successful operation of the SSF-PLL, $t_D$ should be known.

Figure 13:
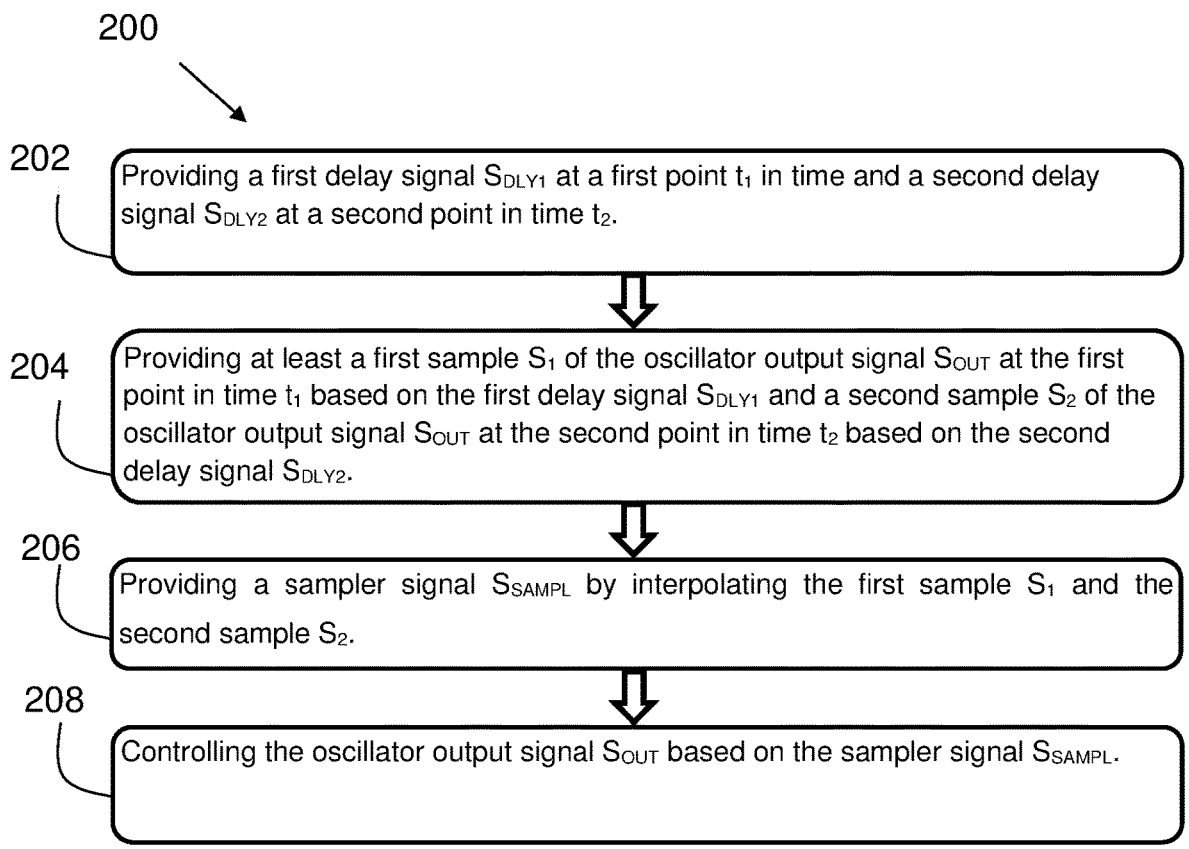
FIG. 13 illustrates a method according to an embodiment of the invention.

FIG. 13 illustrates a method according to an embodiment of the invention. In a first step 202 a first delay signal $S_{DLY1}$ is provided at a first point $t_1$ in time and a second delay signal $S_{DLY2}$ is provided at a second point in time $t_2$. The first point in time $t_1$ is before a first ideal sampling instant for the oscillator output signal $S_{OUT}$ and the second point in time $t_2$ is after a second ideal sampling instant for the oscillator output signal $S_{OUT}$. In a second step 204, succeeding the first step providing 202, at least a first sample $S_1$ of the oscillator output signal $S_{OUT}$ is provided at the first point in time $t_1$ based on the first delay signal $S_{DLY1}$ and a second sample $S_2$ of the oscillator output signal $S_{OUT}$ is provided at the second point in time $t_2$ based on the second delay signal $S_{DLY2}$. In a third step 206 a sampler signal $S_{SAMPL}$ is provided by interpolating the first sample $S_1$ and the second sample $S_2$. Finally, in a fourth step 208 the oscillator output signal $S_{OUT}$ is controlled based on the sampler signal $S_{SAMPL}$.

It is not necessary, as shown in FIG. 2, to use two DTCs. If a single DTC can output two consecutive reference edges, the two samplers may be clocked by these.

It is possible to interpolate more than two samples. This might have the added benefit of averaging differences in the step size of the DTC(s). This will increase the complexity of the interpolator.

Furthermore, any method according to the embodiments of the present invention may be implemented in a computer program, having code means, which when run by processing means causes the processing means to execute the steps of the method. The computer program is included in a computer readable medium of a computer program product. The computer readable medium may comprises of essentially any memory, such as a ROM (Read-Only Memory), a PROM (Programmable Read-Only Memory), an EPROM (Erasable PROM), a Flash memory, an EEPROM (Electrically Erasable PROM), or a hard disk drive.

Finally, it should be understood that the present invention is not limited to the embodiments described above, but also relates to and incorporates all embodiments within the scope of the appended independent claims.

What is claimed is:

1. A sub-sampling phase-locked loop comprising:
   a digital-to-time converter (DTC) comprises two separate digital-to-time converter (DTC) modules,
   a sampler module,
   an interpolator,
   an oscillator which is voltage controlled, and
   a filter comprising an input and an output, wherein the input is connected to an output of the interpolator;
   wherein the digital-to-time converter is configured to:
      provide a first delay signal and a second delay signal to the sampler module,
      receive a reference signal and a control signal, the control signal defining a factor between a desired frequency of the oscillator output signal and a frequency of the reference signal;
      produce a converter signal defining possible points in time for sampling; and
      provide the first delay signal and the second delay signal based on the converter signal, the reference signal and the control signal
      wherein the first delay signal and the second delay signal are provided by the two DTC modules, based on the converter signal, the reference signal and the control signal, and wherein the converter signal is produced by the DTC modules for defining possible points in time for sampling;
   wherein the sampler module is configured to provide a first sample of an oscillator output signal based on the first delay signal and a second sample of the oscillator output signal based on the second delay signal;
   wherein the interpolator is configured to provide a sampler signal by interpolating the first sample and the second sample;
   wherein the oscillator is configured to control the oscillator output signal based on the sampler signal, and provide the oscillator output signal to the sampler module, and
   wherein the filter is configured to low-pass filter the sampler signal.

2. The sub-sampling phase-locked loop according to claim 1, further comprising: a modulator configured to receive the control signal and provide modulator signals for controlling the two DTC modules.

3. The sub-sampling phase-locked loop according to claim 1, wherein the sampler module comprises:
   a first sampler, and
   a second sampler,
   wherein the first sampler is configured to provide the first sample based on the first delay signal, and
   wherein the second sampler is configured to provide the second sample based on the second delay signal.

4. The sub-sampling phase-locked loop according to claim 3, wherein
   the first sampler comprises a first adjustable capacitor device and a first switch, wherein the first switch is arranged between an input of the first sampler and the first adjustable capacitor device;
   the second sampler comprises a second adjustable capacitor device and a second switch, wherein the second switch is arranged between an input of the second sampler and the second adjustable capacitor device.

5. The sub-sampling phase-locked loop according to the claim 4, wherein
   the interpolator comprises a third switch and a fourth switch, wherein the third switch is arranged between the first adjustable capacitor device and an output of the interpolator, and the fourth switch is arranged between the second adjustable capacitor device and the output of the interpolator.

6. The sub-sampling phase-locked loop according to the claim 5, further comprising:
   a controller, which is configured to adjust the capacitance of the adjustable capacitor devices, and the switches.

7. The sub-sampling phase-locked loop according to claim 4, wherein each of the first adjustable capacitor device and the second adjustable capacitor device comprises M number of engagable unit-sized capacitors, wherein M is an integer, and M≥1.

8. The sub-sampling phase-locked loop according to claim 1, wherein the sampler module comprises
   a first sampler, and
   a second sampler,
   wherein the first sampler comprises a first switch, wherein the first switch is controlled by the first delay signal, and
   wherein the second sampler comprises a second switch, wherein the second switch is controlled by the second delay signal.

9. The sub-sampling phase-locked loop according to claim 3, wherein the first sampler comprises: an input for the oscillator output signal, a delay signal input for the first delay signal and an output for the first sample;
   the second sampler comprises an input for the oscillator output signal, a delay signal input for the second delay signal and an output for the second sample.

10. The sub-sampling phase-locked loop according to claim 9, further comprising:
    a first buffer amplifier, which is configured to connect the output of the first sampler;
    a second buffer amplifier is connected to the output of the second sampler to provide a high-ohmic load for each sampler.

11. The sub-sampling phase-locked loop according to claim 9, wherein the interpolator comprises:
    a first input, which is configured to receive the first sample,
    a second input, which is configured to receive the second sample,
    M number of resistors, which is connected in series between the first input and the second input, wherein M is an integer, and M≥2, and the M resistors are connected with conductors, and
    an interpolator output, which is connected to any one of (a), (b) and (c):
    (a) the conductors,
    (b) the first input to provide the sampler signal on the interpolator output, and
    (c) the second input to provide the sampler signal on the interpolator output.

12. The sub-sampling phase-locked loop according to claim 9, further comprising:
    a variable gain amplifier, which is connected to the output of the first sampler and the output of the second sampler, wherein the variable gain amplifier is configured to amplify a difference between the output of the first sampler and the output of the second sampler;

an analogue-to-digital converter, which is connected to the output of the variable gain amplifier, wherein the analogue-to-digital converter is configured to convert the difference between the output of the first sampler and the output of the second sampler to a digital signal;

a gain adjustment block, configured to form a feedback loop that adjusts a gain of the variable gain amplifier.

13. The sub-sampling phase-locked loop according to claim 1, further comprising:
a charge-pump, which acts as an intermediate circuit and arranged between the interpolator and the filter.

14. The sub-sampling phase-locked loop according to claim 1, wherein
the DTC comprises a digital-to-time converter module,
the interpolator comprises a sampler, and
the sub-sampling phase-locked loop further comprises a modulator and an analogue shift register;
wherein the DTC module comprises a first input, and a second input, wherein the DTC module is configured to receive a reference signal on the first input, and a modulator signal from the output of the modulator on the second input;
the modulator comprises an input and an output, wherein the modulator is configured to receive a control signal on the input and to provide control signals for controlling the digital-to-time converter module, wherein the control signal defines a factor between a desired frequency of the oscillator output signal and a frequency of the reference signal;
the sampler comprises an input for the oscillator output signal, a delay signal input for the first delay signal and an output for a first sample and a second sample;
the analogue shift register comprises a first cell and a second cell, wherein each of the first sample and the second sample is injected into the first cell and the second cell of the analogue shift register, and the interpolation is performed between the first sample S1=S[k] and the second sample S2=S[k−1], wherein k is an integer, and k≥1;
the interpolator comprises a first input for the first sample from the first cell, a second input for the second sample from the second cell and an output, wherein the interpolator is configured to interpolate between the first sample and the second sample to produce the sampler signal which is provided on the output of the interpolator.

15. The sub-sampling phase-locked loop according to claim 14, further comprising:
a filter, comprising an input connected to the output of the interpolator and an output, wherein the filter is configured to low-pass filter the sampler signal;
wherein the oscillator comprises an input coupled to the output of the filter and an output for the oscillator output signal, wherein the voltage controlled oscillator is configured to control the oscillator output signal based on the filtered sampler signal.

16. A method, implemented by a sub-sampling phase-locked loop, the method comprising:
providing, by a digital-to-time converter (DTC) of the sub-sampling phase-locked loop, a first delay signal and a second delay signal, to a sampler module of the sub-sampling phase-locked loop,
providing, by the sampler module of the sub-sampling phase-locked loop, a first sample of an oscillator output signal based on the first delay signal and a second sample of the oscillator output signal based on the second delay signal;
providing, by an interpolator of the sub-sampling phase-locked loop, a sampler signal by interpolating the first sample and the second sample; and
controlling and providing, by an oscillator of the sub-sampling phase-locked loop, the oscillator output signal based on the sampler signal to the sampler module of the sub-sampling phase-locked loop,
low pass filtering the sampler signal, by a filter comprising an input and an output wherein the input is connected to an output of the interpolator
receiving, by the DTC of the sub-sampling phase-locked loop, a reference signal and a control signal, the control signal defining a factor between a desired frequency of the oscillator output signal and a frequency of the reference signal;
producing, by the DTC of the sub-sampling phase-locked loop, a converter signal defining possible points in time for sampling; and
providing, by the DTC of the sub-sampling phase-locked loop, the first delay signal and the second delay signal based on the converter signal, the reference signal and the control signal.

* * * * *